(12) United States Patent
Shani et al.

(10) Patent No.: US 10,534,124 B2
(45) Date of Patent: Jan. 14, 2020

(54) ILLUMINATION APPARATUS CONFINING LIGHT BY TOTAL INTERNAL REFLECTION AND METHODS OF FORMING THE SAME

(71) Applicants: Yosi Shani, Maccabim (IL); Dafna B. Arbiv, Zichron Yaacov (IL); Baruch Schiffmann, Shoham (IL); Avner Badihi, Nataf (IL); Eran Fine, Tel Aviv (IL); Gadi Segal, Ramat Gan (IL)

(72) Inventors: Yosi Shani, Maccabim (IL); Dafna B. Arbiv, Zichron Yaacov (IL); Baruch Schiffmann, Shoham (IL); Avner Badihi, Nataf (IL); Eran Fine, Tel Aviv (IL); Gadi Segal, Ramat Gan (IL)

(73) Assignee: OREE ADVANCED ILLUMINATION SOLUTIONS LTD., Rosh Haain (IL)

(*) Notice: Subject to any disclaimer, the term of this patent is extended or adjusted under 35 U.S.C. 154(b) by 0 days.

(21) Appl. No.: 15/938,339

(22) Filed: Mar. 28, 2018

(65) Prior Publication Data
US 2018/0284336 A1    Oct. 4, 2018

Related U.S. Application Data

(63) Continuation of application No. 15/795,484, filed on Oct. 27, 2017, now Pat. No. 9,958,589, which is a (Continued)

(51) Int. Cl.
*H05B 33/12*   (2006.01)
*G02B 5/02*    (2006.01)
(Continued)

(52) U.S. Cl.
CPC .......... *G02B 6/0021* (2013.01); *F21K 9/61* (2016.08); *G02B 6/0003* (2013.01); *G02B 6/009* (2013.01); *G02B 6/0016* (2013.01); *G02B 6/0025* (2013.01); *G02B 6/0031* (2013.01); *G02B 6/0073* (2013.01); *G02B 6/0083* (2013.01); *G02B 6/0091* (2013.01); *H01L 33/483* (2013.01); *H01L 33/56* (2013.01); *H01L 2924/0002* (2013.01)

(58) Field of Classification Search
CPC .... G02B 6/0021; G02B 6/0031; G02B 6/009; G02B 6/0016; G02B 6/0073; G02B 6/0003; G02B 6/0083; G02B 6/0025; G02B 6/0091; F21K 9/61; H01L 33/483; H01L 2924/0002; H01L 33/56
See application file for complete search history.

(56) References Cited

U.S. PATENT DOCUMENTS 6,473,554 B1 * 10/2002 Pelka ............... G02B 6/0018
                                                   385/146
8,591,072 B2 * 11/2013 Shani ............... G02B 6/0021
                                                   362/296.01
(Continued)

*Primary Examiner* — Tracie Y Green
(74) *Attorney, Agent, or Firm* — Morgan, Lewis & Bockius LLP

(57) ABSTRACT

In various embodiments, an illumination apparatus includes an air gap between a sub-assembly and a waveguide attached thereto at a plurality of discrete attachment points, as well as a bare-die light-emitting diode encapsulated by the waveguide.

20 Claims, 6 Drawing Sheets

Related U.S. Application Data continuation of application No. 15/647,361, filed on Jul. 12, 2017, now Pat. No. 9,829,620, which is a continuation of application No. 15/373,171, filed on Dec. 8, 2016, now Pat. No. 9,739,924, which is a continuation of application No. 14/691,816, filed on Apr. 21, 2015, now Pat. No. 9,547,114, which is a continuation of application No. 14/464,319, filed on Aug. 20, 2014, now Pat. No. 9,039,244, which is a continuation of application No. 14/060,145, filed on Oct. 22, 2013, now Pat. No. 8,840,276, which is a continuation of application No. 13/398,951, filed on Feb. 17, 2012, now Pat. No. 8,591,072.

(60) Provisional application No. 61/560,293, filed on Nov. 16, 2011.

(51) Int. Cl.
*F21V 8/00* (2006.01)
*F21K 9/61* (2016.01)
*H01L 33/48* (2010.01)
*H01L 33/56* (2010.01)

(56) References Cited

U.S. PATENT DOCUMENTS

| | | |
|---|---|---|
| 8,840,276 B2 | 9/2014 | Shani et al. |
| 9,039,244 B2 | 5/2015 | Shani et al. |
| 9,547,114 B2 | 1/2017 | Shani et al. |
| 9,739,924 B2 | 8/2017 | Shani et al. |
| 9,829,620 B2 | 11/2017 | Shani et al. |
| 2009/0141476 A1 | 6/2009 | Meir et al. |
| 2009/0225565 A1 | 9/2009 | Zimmermann et al. |
| 2010/0220484 A1* | 9/2010 | Shani ............... G02B 5/021 362/296.09 |
| 2013/0033164 A1 | 2/2013 | Shani |

\* cited by examiner ing the present invention relates to
ILLUMINATION APPARATUS CONFINING LIGHT BY TOTAL INTERNAL REFLECTION AND METHODS OF FORMING THE SAME

CROSS-REFERENCE TO RELATED APPLICATION

This application is a continuation of U.S. patent application Ser. No. 15/795,484, filed on Oct. 27, 2017, which is a continuation of U.S. patent application Ser. No. 15/647,361, filed on Jul. 12, 2017, which is a continuation of U.S. patent application Ser. No. 15/373,171, filed on Dec. 8, 2016, which is a continuation of U.S. patent application Ser. No. 14/691,816, filed on Apr. 21, 2015, which is a continuation of U.S. patent application Ser. No. 14/464,319, filed on Aug. 20, 2014, which is a continuation of U.S. patent application Ser. No. 14/060,145, filed on Oct. 22, 2013, which is a continuation of U.S. patent application Ser. No. 13/398,951, filed on Feb. 17, 2012, which claims priority to and the benefit of U.S. Provisional Patent Application No. 61/560,293, filed on Nov. 16, 2011, the entire disclosure of each of which is incorporated by reference herein.

FIELD OF THE INVENTION

In various embodiments, the present invention relates to artificial illumination, and in particular to an illumination apparatus confining light therewithin by total internal reflection.

BACKGROUND

Light-emitting diodes (LEDs) are gradually replacing incandescent light bulbs in various applications, including traffic signal lamps, large-sized full-color outdoor displays, various lamps for automobiles, solid-state lighting devices, flat panel displays, and the like. Conventional LEDs typically include a light-emitting semiconductor material, also known as the bare die, and numerous additional components designed for improving the performance of the LED. These components may include a light-reflecting cup mounted below the bare die, a transparent encapsulation (typically silicone) surrounding and protecting the bare die and the light reflecting cup, and electrical leads for supplying the electrical current to the bare die. The bare die and the additional components are efficiently packed in an LED package.

LEDs also represent an attractive alternative light source for general lighting applications and for backlights for liquid crystal displays, where they enable extremely low-thickness (or "low-profile") solutions. One conventional geometry for such illumination solutions is the so-called edge-lit configuration, in which a packaged LED is attached to the shorter, narrow side (or "face") of a waveguide, and the light is emitted through the broader "top" face of the waveguide. Increased coupling efficiencies may be obtained by embedding the bare LED die within the waveguide itself, rather than by separately encapsulating or packaging the die before coupling it to the waveguide. However, since the geometric dimensions of a waveguide typically are far larger than those of the LED die, it is often challenging to achieve and maintain the high coupling efficiency enabled by embedding the bare die while also forming a strong mechanical connection between the various components of the completed system. The LED die is typically mounted on a platform, or a "sub-assembly" that provides mechanical support and electrical connectivity to an external power source. The presence and geometry of the LED sub-assembly may present difficulties when attempting to embed the LED die within the waveguide with high coupling efficiency.

FIGS. 1A (cross-section) and 1B (bottom view) depict an illumination device 100 that features an LED 105 mounted on a sub-assembly 110 and coupled within a recess 115 in a waveguide 120. As shown, the waveguide 120 has the shape of a thin plate with flat top and bottom faces, which may be parallel, as shown, or may be angled toward each other, giving the waveguide 120 the shape of a wedge. Mirrors (or mirror coatings) may be present along the bottom and side faces of waveguide 120. During operation of the illumination device 100, light from the LED 105 is coupled in to an input region 130 of the waveguide 120 via an input coupling element 135. The light then propagates toward an output region 140 by means of total internal reflection (TIR) off of the top and bottom faces of the waveguide 120. (As known to those of skill in the art, TIR depends at least on the refractive-index difference of two materials at the boundary therebetween, as well as the angle of the light impinging upon the boundary.) In the output region 140, the light is out-coupled from the waveguide 120 by, e.g., embedded scattering elements 145 that disrupt the TIR propagation, resulting in emitted light 150.

Devices such as illumination device 100 present an extremely difficult challenge—the need to, within the small thickness of the waveguide 120, convert light not emitted from the LED 105 in the TIR condition into light propagating in waveguide 120 via TIR. This conversion generally must be performed within a very small area in order to prevent additional loss of light from impingements of light on the waveguide faces in non-TIR conditions. This, in turn, constrains the area of the LED sub-assembly 110, as the top face of the sub-assembly 110 generally does not reflect light at TIR conditions and/or may even absorb light from the LED 105, diminishing overall efficiency.

However, for devices such as illumination device 100 to have adequate mechanical stability, the area of the "joint" between the waveguide 120 and the LED sub-assembly 110 is typically much larger than that of the LED die itself, resulting in the above-described efficiency-diminishing area of the sub-assembly surrounding the LED die. This additional sub-assembly area increases the cross-section of contact between the waveguide and the sub-assembly, strengthening the connection, but also results in decreased input coupling efficiency.

FIG. 2 depicts one conventional approach to addressing this trade-off, in which only the "optical connection" (i.e., the proximity enabling in-coupling of light from the LED) between the LED and the waveguide is made in immediate proximity to the LED, and the mechanical support between the waveguide and the sub-assembly is provided separately. As shown, an illumination device 200 features an LED 210 mounted on a larger sub-assembly 220 that is joined to a waveguide 230. The LED 210 is flanked by two mechanical connections 240 that provide mechanical support when the sub-assembly 220 is joined to the waveguide 230. In many such designs, it is recognized that light emitted from the LED in one or more lateral directions (e.g., the indicated x-direction) will not reach the output region even in the absence of mechanical connections that may block or absorb such light. Specifically, much of the light reaching the side faces of the waveguide in such directions will not reach the output region due to their multiple reflections, in the x-direction, in the input-region. Thus, conventional designs may place the mechanical connections 240 in such locations, as light lost via interaction therewith may well not have been efficiently coupled into the bulk of the waveguide anyway; thus, losses associated with the mechanical connections may have little additional impact on the input coupling efficiency.

Exacerbating the impact of mechanical supports on the input coupling efficiency is the fact that the optical connection between the LED and the waveguide is typically achieved via a "dam and fill" process, in which a low-viscosity dam of encapsulant is formed between (and in contact with) the sub-assembly and the waveguide and then filled with higher-viscosity index-matching material. Such processes fill the entire in-coupling region near the LED with the index-matching material, which increases the size of the surrounding region incapable of TIR-based confinement of the LED light (because, since the index-matching material contacts the waveguide and the light-absorbing sub-assembly, light propagating toward the sub-assembly is simply absorbed or otherwise lost rather than reflected into a TIR mode and efficiently in-coupled). Thus, in view of the challenges and disadvantages of conventional waveguide-based illumination devices described above, there is a need for illumination devices having increased mechanical stability without associated in-coupling losses that adversely impact overall efficiency.

SUMMARY

In accordance with various embodiments of the present invention, illumination devices achieve sufficient mechanical stability while also minimizing the contact area between the waveguide and the LED sub-assembly. Rather than utilize a dam-and-fill encapsulation scheme, embodiments of the invention encapsulate the bare LED die either in the waveguide material itself (i.e., with no gaps or other materials therebetween) or in one or more index-matching materials between the LED die and the waveguide material. In the latter case, for example, the LED die may be encapsulated in index-matching material on the LED sub-assembly and then immerse the encapsulated LED die in additional index-matching material (which may be the same as or different from the first index-matching material) present in a recess (and in some embodiments, present only in the recess) in the waveguide. This structure enables the formation of an air gap between the waveguide and the LED sub-assembly during attachment thereof, thereby enabling TIR of light in the waveguide in the vicinity of the sub-assembly. That is, light is confined due to the refractive-index difference between the waveguide and the air gap, rather than being absorbed or otherwise lost via propagation directly into or scattering from a sub-assembly in intimate contact with the waveguide. Furthermore, the index-matching material within the recess may not contact the sub-assembly after immersion of the LED die, thereby maintaining an air gap therebetween across as much area as possible. Thus, the minimized contact area between the LED die and the index-matching material reduces or even substantially eliminates in-coupling losses associated with light propagation to the sub-assembly.

Preferably, the recess in the waveguide has a cross-sectional area and/or volume that is minimized while still accommodating immersion of the LED die therein in order to minimize any "non-TIR region," i.e., a region within the illumination device where in-coupled like is not confined by TIR. The index-matching materials preferably have refractive indices between those of the LED die itself and the waveguide in order to optimize extraction of light from the LED die and coupling of the light into the waveguide. Once the LED die is immersed in the index-matching material in the recess, the surface of the index-matching material surrounding the LED die is preferably substantially parallel to the bottom face of the waveguide, and thereby itself forms a TIR confinement region (also due to the air gap therebelow). Thus, not only does the bottom surface of the waveguide around the recess confine light by TIR, but a portion of the recess itself does as well via the index-matching material.

Preferably, bare LED dies utilized in embodiments of the present invention have rectangular cross-sections with the longer face parallel to the x direction (see FIG. 2), i.e., facing toward the output region of the waveguide. Thus, such LED dies typically emit more light in a desired direction toward the output region.

In an aspect, embodiments of the invention feature an illumination device including or consisting essentially of a waveguide, a sub-assembly attached to a first surface of the waveguide only at a plurality of discrete attachment points, and a bare-die LED mechanically coupled to the sub-assembly and disposed within the waveguide, light emitted by the bare-die LED being in-coupled into the waveguide. An air gap separates the first surface of the waveguide and the sub-assembly between the plurality of discrete attachment points.

Embodiments of the invention include one or more of the following in any of a variety of combinations. A spacer may mechanically couple the bare-die LED to the sub-assembly and raise the bare-die LED above the top surface of the sub-assembly. The waveguide may include a second surface for emitting light emitted by the bare-die LED and propagating within the waveguide. The second surface may be opposite the first surface, and the first and second surfaces may even be substantially planar. Alternatively, the first and second surfaces may be adjoining and not parallel, e.g., substantially perpendicular to each other. An in-coupling element (e.g., a reflector, a prism, and/or one or more scattering elements) for converting light emitted by the bare-die LED from an unconfined mode to a confined mode may be disposed in the waveguide above the bare-die LED. The waveguide may have a second surface opposite the first surface, and a substantially opaque absorber for blocking propagation of light through a second surface of the waveguide may be disposed over the second surface. The absorber may be attached to the second surface only at a second plurality of discrete attachment points; an air gap may thus be disposed between the second surface of the waveguide and the absorber between the second plurality of discrete attachment points.

An adhesive material (e.g., a flexible adhesive) may be disposed at each of the plurality of discrete attachment points. The waveguide may define a plurality of protrusions from the first surface; each of the protrusions may be disposed at one of the discrete attachment points, and the maximum height of the protrusions above the first surface may be approximately equal to the thickness of the air gap. A plurality of discrete separators may be disposed between the first surface and the sub-assembly; each of the separators may be disposed at one of the discrete attachment points, and the thickness of the separators may be approximately equal to a thickness of the air gap. Each separator may be attached to the first surface and/or to the sub-assembly with an adhesive material. At least one discrete attachment point may be disposed on a relief defined by at least one relief trench extending through the thickness of the sub-assembly. The relief may be elastically deformable in at least a first direction substantially perpendicular to the first surface, and the relief may even be elastically deformable in a second direction substantially perpendicular to the first direction. At least one discrete attachment point may not be disposed on a relief and may thereby not be elastically deformable. The plurality of discrete attachment points may be disposed in a line substantially perpendicular to a propagation direction extending from the bare-die LED to an output region of the waveguide (e.g., a portion of the second surface of the waveguide spaced away from the bare-die LED and any recess in the waveguide).

The waveguide may define a recess in the first surface, and the bare-die LED may be disposed within the recess. At least one index-matching material may fill at least a portion of the recess and encapsulate the bare-die LED, thereby facilitating in-coupling of light emitted by the bare-die LED into the waveguide. A free surface of at least one of the index-matching materials in the recess may be spaced away from the sub-assembly, thereby defining a second air gap between the sub-assembly and the free surface. The free surface may be substantially parallel to the first surface of the waveguide. In a propagation direction extending from the bare-die LED to an output region of the waveguide, a dimension of the recess may be no more than three times (or no more than two times, or even approximately equal to) a dimension of the bare-die LED in the propagation direction.

In another aspect, embodiments of the invention feature a method of forming an illumination device incorporating a bare-die LED mechanically coupled to a sub-assembly. The sub-assembly is attached to a first surface of a waveguide at only a plurality of discrete attachment points, thereby defining an air gap disposed between the first surface of the waveguide and the sub-assembly between the plurality of discrete attachment points. The bare-die LED is encapsulated within a recess defined by the waveguide in the first surface, thereby facilitating in-coupling of light emitted by the bare-die LED into the waveguide.

Embodiments of the invention include one or more of the following in any of a variety of combinations. Encapsulating the bare-die LED may include or consist essentially of at least partially surrounding the bare-die LED with at least one index-matching material. At least one such index-matching material may be disposed within the recess before the sub-assembly is attached to the first surface of the waveguide. Encapsulating the bare-die LED may include or consist essentially of at least partially surrounding the bare-die LED with a first index-matching material prior to attachment of the sub-assembly to the first surface of the waveguide, disposing a second index-matching material within the recess prior to attachment of the sub-assembly to the first surface of the waveguide, and at least partially surrounding the bare-die LED and a portion of the first index-matching material with the second index-matching material during attachment of the sub-assembly to the first surface of the waveguide. At least one discrete attachment point may be disposed on a relief defined by at least one relief trench extending through the thickness of the sub-assembly. The relief may be elastically deformable in at least a first direction substantially perpendicular to the first surface, and the relief may even be elastically deformable in a second direction substantially perpendicular to the first direction. At least one discrete attachment point may not be disposed on a relief and may thereby not be elastically deformable. Attaching the sub-assembly to the first surface of the waveguide may include or consist essentially of forming the plurality of discrete attachment points via dispersal of an adhesive between the sub-assembly and the waveguide at each of the discrete attachment points.

In yet another aspect, embodiments of the invention include a method of forming an illumination device incorporating a bare-die LED. The bare-die LED is encapsulated within a waveguide by disposing the bare-die LED within a waveguide material such that the waveguide material directly contacts, without a gap therebetween, either the bare-die LED or an index-matching material disposed around and in direct contact with the bare-die LED.

Embodiments of the invention include one or more of the following in any of a variety of combinations. A sub-assembly may be attached to a first surface of the waveguide at only a plurality of discrete attachment points, thereby defining an air gap disposed between the first surface of the waveguide and the sub-assembly between the plurality of discrete attachment points. The waveguide may define a plurality of protrusions from the first surface, each protrusion being disposed at one of the discrete attachment points; the maximum height of the protrusions above the first surface may be approximately equal to the thickness of the air gap. The waveguide and the sub-assembly may be brought into contact at the plurality of discrete attachment points substantially simultaneously with the bare-die LED being encapsulated within the waveguide. At least one discrete attachment point may be disposed on a relief defined by at least one relief trench extending through the thickness of the sub-assembly. The relief may be elastically deformable in at least a first direction substantially perpendicular to the first surface, and the relief may even be elastically deformable in a second direction substantially perpendicular to the first direction. At least one discrete attachment point may not be disposed on a relief and may thereby not be elastically deformable. The bare-die LED may be encapsulated substantially simultaneously with formation of the waveguide. The index-matching material may be disposed around the bare-die LED prior to encapsulating the bare-die LED within the waveguide.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean±10%, and in some embodiments, ±5%, unless otherwise indicated. The term "consists essentially of" means excluding other materials or structures that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 3:
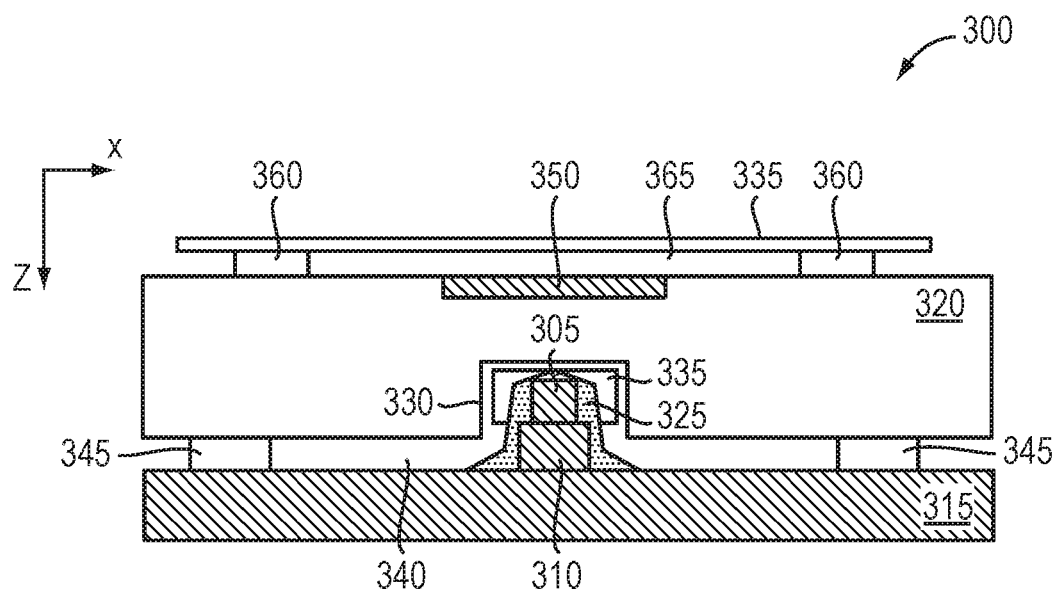
FIGS. 3-5 are cross-sectional views of illumination devices having one or more LEDs optically coupled within a waveguide in accordance with various embodiments of the present invention.

FIG. 3 depicts an illumination device 300 in accordance with embodiments of the present invention. As shown, illumination device 300 includes one or more bare LED dies 305 mounted on a spacer 310 on an LED sub-assembly 315. The spacer (which may be different and discrete from the sub-assembly 315, or may simply be a raised portion thereof) elevates the LED die 305 above the plane of the sub-assembly 315, which is preferably otherwise substantially planar, thus facilitating the optical connection between the LED 305 and a waveguide 320. The waveguide 320 is preferably substantially optically transparent, but may also incorporate various features (e.g., scatterers, reflectors, etc.) for the in-coupling, reflection, and out-coupling of light confined therein. The waveguide 320 may include or consist essentially of one or more polymeric materials, e.g., latex, polyvinylchloride, nitrile, chloroprene (Neoprene), poly(cis-isoprene), poly(2,3-dimethylbutadiene), poly(dimethylsiloxane), ethylene/vinyl acetate copolymer-40% vinyl acetate, ethylene/vinyl acetate copolymer-30% vinyl acetate, poly(butadiene-co-acrylonitrile), natural rubber, poly(chloroprene), polymethylmethacrylate, and/or polycarbonate. The sub-assembly 315 may include or consist essentially of one or more suitably rigid materials, e.g., a printed circuit board (PCB) or a metal-core PCB.

In various embodiments of the present invention, the LED die 305 is encapsulated with an index-matching material 325 prior to the connection of sub-assembly 315 with waveguide 320. The index-matching material 325 preferably has an index of refraction between those of the LED die 305 and the waveguide 320 in order to facilitate light extraction from the LED die 305 and in-coupling of the light into the waveguide 320. The index-matching material 325 may also advantageously cover any wires, other electrical connections, contact pads, and the like, and may thus protect such elements from damage and/or elemental exposure. As shown, the index-matching material 325 may additionally coat at least a portion (or even substantially all of) the spacer 310, and may even coat portions of the sub-assembly 315 surrounding the spacer 310. Index-matching material 325 may be dispensed over the LED die 305 in liquid or gel form, and then partially or fully cured before sub-assembly 315 is connected to the waveguide 320.

In various embodiments of the invention, once the LED die 305 is encapsulated with the index-matching material 325, LED die 305 is positioned into a recess (or "cavity") 330 in the waveguide 320, and a high-coupling-efficiency optical connection between the LED die 305 and the waveguide is enabled via an index-matching material 335. The index-matching material 335 may include or consist essentially of the same material as index-matching material 325, or it may be a different material. For example, the index of refraction of index-matching material 335 may be between those of index-matching material 325 and waveguide 320. Index-matching materials 325, 335 may each (or both) include or consist essentially of, e.g., silicone and/or epoxy.

In one embodiment of the invention, the index-matching material 335 is dispensed into the recess 330 prior to the LED die 305 being positioned therein. The waveguide 320 may be positioned with the recess 330 opening upwards, and may be positioned such that the bottom surface of the waveguide 320 is substantially perpendicular to the force of gravity. Thus, once the LED die 305 is positioned within the recess 330, the index-matching material 335 settles such that the surface thereof is substantially parallel to the bottom surface of the waveguide 320 (i.e., the surface of the waveguide 320 in which the recess 330 is formed). The sub-assembly 310 is then positioned proximate the waveguide 320 such that the LED die 305 is positioned within the recess 330 and surrounded (at least light-emitting portions thereof) by the index-matching material 335. The index-matching material 335 may initially be dispensed in a liquid or gel form and may be fully or partially cured once LED die 305 is positioned therewithin. As mentioned, after the optical connection of LED die 305 into the waveguide 320 (via the index-matching material 335), the exposed surface of the index-matching material 335 is preferably substantially parallel to the bottom surface of the waveguide 320 and spaced away from the sub-assembly 315. As shown in FIG. 3, the exposed surface of the index-matching material 335 is not necessarily coplanar with the bottom surface of the waveguide 320 (thus substantially filling the recess 330), but in some embodiments it is coplanar therewith.

In an alternative embodiment of the invention, the LED die 305 is positioned within a substantially empty recess 330 by bringing the sub-assembly 315 proximate the waveguide 320. Then, the index-matching material 335 may be injected into the partially occupied recess 330, surrounding the LED die 305. As described above, the index-matching material 335 may be dispensed as a liquid or gel and partially or fully cured afterwards. Also, after the index-matching material 335 is injected around the LED die 305, the exposed surface of the index-matching material is preferably substantially parallel to the bottom surface of the waveguide 320 and spaced away from the sub-assembly 315, as described above.

In some embodiments of the invention, as shown in FIG. 3, the LED die 305 is positioned within the recess 330 substantially spaced away from the walls and the surface of the waveguide 320 disposed above the LED die 305 and defined by recess 330. In other embodiments the top surface of LED die 305 (or the index-matching material 325, if present on the top surface of LED die 305) is in direct contact with the surface of waveguide 320 within the recess 330; thus, light emitted from the top surface of the LED die 305 is coupled directly into the waveguide 320 without necessarily traversing index-matching material. In either type of embodiment there is preferably no empty gap between a light-emitting portion of the LED die 305 and the waveguide 320—such space is either nonexistent or filled with one or more index-matching materials.

Figure 1A:
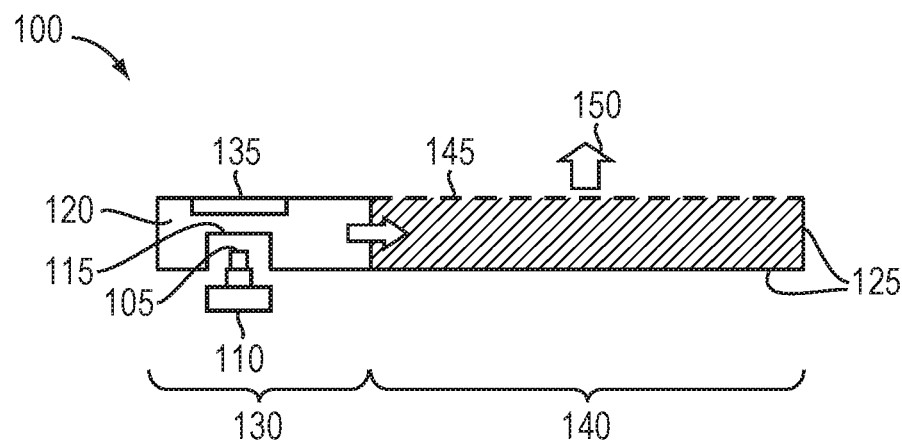
FIGS. 1A and 1B are a cross-section and a bottom view, respectively, of an LED-based illumination device.
Figure 1B:
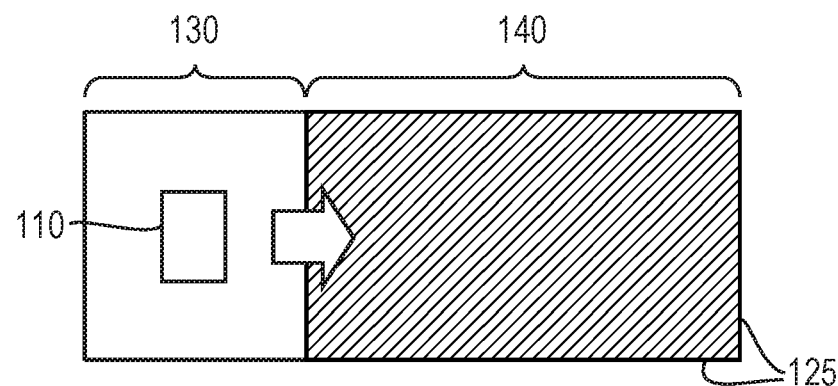
Figure 2:
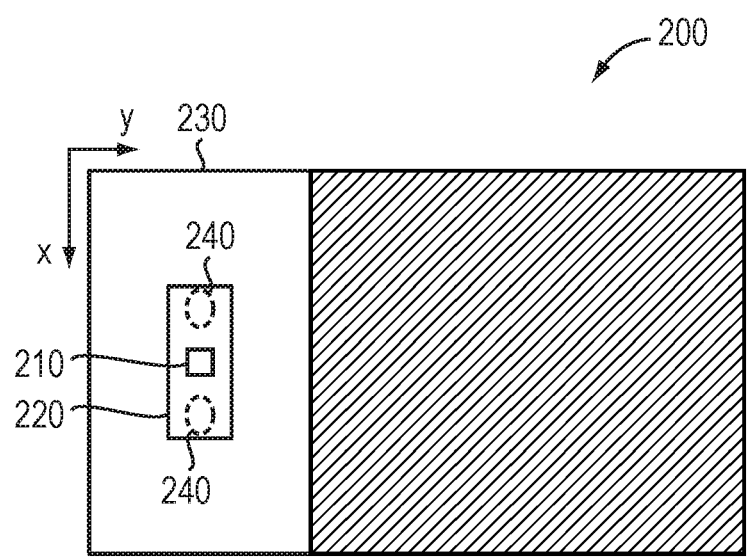
FIG. 2 is a plan view of an LED-based illumination device.

Preferably, TIR within the waveguide 320 in the proximity of LED die 305 and sub-assembly 315 is facilitated by the attachment of waveguide 320 to sub-assembly 315 such than an air gap 340 is formed and maintained therebetween. TIR in this region of the waveguide 320 enables the confinement of light within the waveguide 320, thereby increasing the input coupling efficiency of illumination device 300 (i.e., the amount of light emitted by LED die 305 that is successfully confined within the waveguide 320). The air gap 340 may have a thickness in the range of, e.g., approximately 1 µm to approximately 1000 µm. In order to attach the sub-assembly 315 to the waveguide 320 with sufficient mechanical stability but while maintaining the air gap 340, one or more regions of an adhesive 345 may be disposed between the two parts. The adhesive 345 is preferably spaced away from the recess 330 and/or shaped to have a fairly small area of contact with the waveguide 320, thereby minimizing any absorptive and/or scattering losses resulting from interaction of the light in the waveguide 320 with the adhesive 345. The adhesive 345 may have an index of refraction smaller than that of the waveguide 320 in order to help facilitate TIR within the waveguide 320 in the vicinity of adhesive 345. The adhesive 345 may be disposed in one or more regions substantially perpendicular to the intended light path from the LED die 305 to the emission surface of the waveguide 320, e.g., as shown for the reinforcements in FIG. 2.

Illumination device 300 may also incorporate one or more in-coupling elements 350 disposed above the recess 330 (and preferably proximate or even at the surface of waveguide 320 opposite recess 330). The in-coupling element 350 may include or consist essentially of, e.g., a reflector (which may be planar and/or curved), a prism, or one or more scattering elements such as bubbles or surface features such as hemispheres. In-coupling element 350 facilitates the in-coupling of light emitted by the LED die 305 into the bulk of the waveguide 320 by redirecting one or more portions of light not already propagating therewithin in a TIR condition. Because the in-coupling element 350 (and/or other portions of the waveguide 320) may be an imperfect reflector and/or may allow some finite amount of light to propagate therethrough, the illumination device 300 may also incorporate an absorber 355 that absorbs and/or reflects such light, thereby preventing its escape into the surrounding ambient. The absorber is preferably substantially opaque and may include or consist essentially of, e.g., one or more metallic, plastic, and/or ceramic materials. As with the attachment of the sub-assembly 315 to waveguide 320, the absorber 355 may be attached via, e.g., one or more regions of an adhesive 360 (which may be the same as or different from adhesive 345) such that an air gap 365 is formed and maintained between waveguide 320 and absorber 355. The air gap 365 may have a thickness in the range of, e.g., approximately 1 µm to approximately 1000 µm, and it facilitates the TIR confinement of light within the waveguide 320. A center portion of absorber 355 disposed directly over the recess 330 and/or LED die 305 may be substantially reflective to reflect light back into waveguide 320. As described above for adhesive 345, the adhesive 360 may be disposed in one or more regions substantially perpendicular to the intended light path from the LED die 305 to the emission surface of the waveguide 320, e.g., as shown for the reinforcements in FIG. 2.

In some embodiments of the invention the waveguide 320 has a coefficient of thermal expansion (CTE) different from that of the sub-assembly 315 and/or the absorber 355. In such embodiments, the index-matching materials 325, 335 and/or the adhesives 345, 360 may be selected to mitigate at least a portion of the CTE mismatch between the various components of illumination system 300. For example, either or both of adhesives 345, 360 may be substantially flexible, and any of adhesives 345, 360 and/or index-matching materials 325, 335 may be at least partially gelatinous to thereby absorb CTE-mismatch stresses and prevent the debonding of waveguide 320 from sub-assembly 315 and/or absorber 355. Embodiments of the invention may incorporate other features to reduce CTE-mismatch stresses, as described below with reference to FIGS. 6-9.

Figure 4:
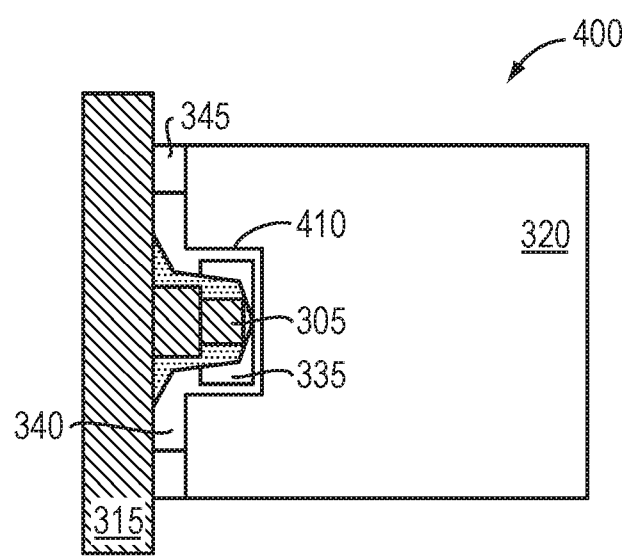

As shown in FIG. 4, embodiments of the invention feature LED dies 305 "edge-coupled" into waveguide 320, i.e., optically connected to a face of waveguide 320 that adjoins (i.e., is not opposite) the top, light-emitting surface thereof. In FIG. 4, an illumination device 400 features an LED die 305 optically connected to the waveguide 320 via index-matching material 335 disposed within an edge recess 400, substantially as described above for recess 330.

Figure 5:
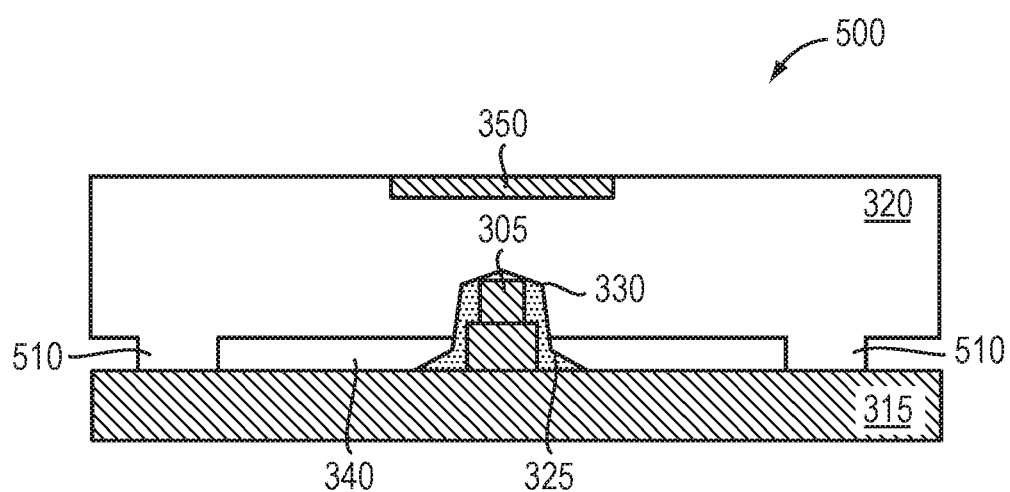

FIG. 5 depicts an exemplary illumination device 500 in which the adhesive 345 is replaced with or supplemented by one or more protrusions 510 that are intimate portions of and protrude from the body of waveguide 320, thereby facilitating formation and maintenance of the air gap 340 when waveguide 320 is attached to the sub-assembly 315. In other embodiments of the invention, the protrusions 510 are portions of and protrude from the sub-assembly 315 (in addition to or instead of protruding from waveguide 320). As shown for the reinforcements in FIG. 2, the protrusions 510 may be disposed in one or more regions substantially perpendicular to the intended light path from the LED die 305 to the emission surface of the waveguide 320. In some embodiments, the protrusions 510 are supplemented or replaced by discrete separators at the attachment points. For example, both the waveguide 320 and the sub-assembly 315 may be substantially planar in the vicinity of the attachment points, and the separators may be attached to both the waveguide 320 and sub-assembly 315 at those points by, e.g., an adhesive. In such cases the thickness of the separators generally defines the thickness of the air gap 340. In other embodiments, either (or both) of the sub-assembly 315 or waveguide 320 may incorporate protrusions 510 that have a thickness smaller than that of the desired air gap 340, and discrete separators are utilized with (and, e.g., adhered to) those protrusions to increase the size of the air gap 340. The separators may include or consist essentially of any suitably rigid material, e.g., one or more of the materials of sub-assembly 315, spacer 310, or waveguide 320.

As also shown in FIG. 5, the waveguide 320 may be formed directly around the LED die 305 and/or the index-matching material 325 (if present); thus, the bare LED die 305 or the LED die encapsulated by index-matching material 325 is encapsulated by the waveguide material itself. For example, the waveguide 320 may be initially formed, e.g., by injection molding, such that it at least partially surrounds LED die 305, or the LED die 305 may be placed within the waveguide material while the waveguide material is in a liquid or gelatinous state, whereupon the material is cured to form waveguide 320 encapsulating the LED die 305. In such embodiments, the bare LED die 305 may have disposed thereupon a layer of index-matching material 325 (as depicted in FIG. 5) or may be disposed in direct contact (i.e., with no intervening gaps or other materials) with the waveguide 320, which may then not define therewithin any other sort of recess.

Figure 6:
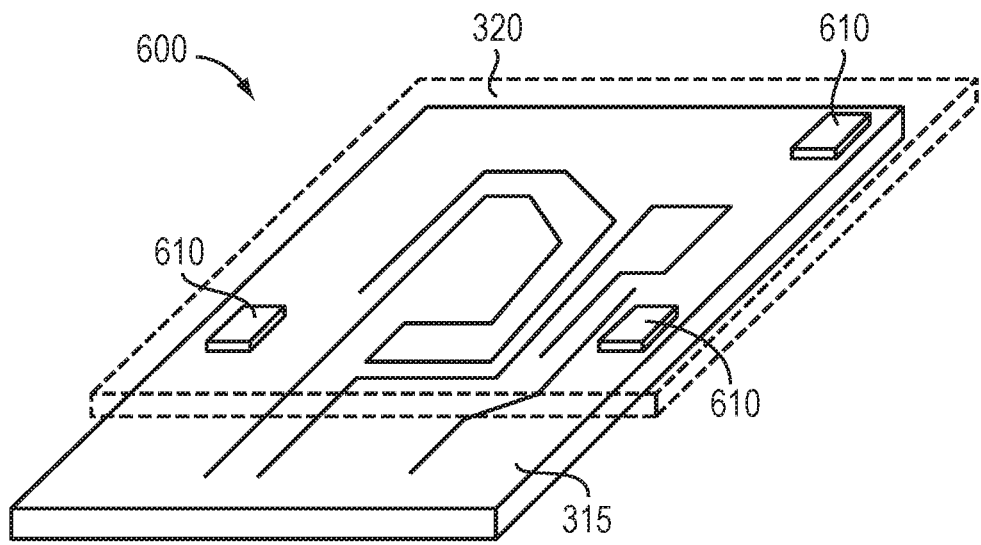
FIG. 6 is a perspective view of an illumination device in accordance with various embodiments of the present invention.

Embodiments of the present invention may also incorporate various features to minimize the impact of CTE mismatch between various components. As shown in FIG. 6, an exemplary illumination device 600 may include or consist essentially of a sub-assembly 315 attached to a waveguide 320 via two or more joining elements 610. (Features such as LED die 305 and recess 330 are not shown in FIGS. 6-9 for clarity but may be present as detailed above.) The joining elements 610 may include or consist essentially of, e.g., adhesive 345 and/or protrusions 510 as described above. The sub-assembly 315 and the waveguide 320 typically have different CTEs, and there is thus a finite amount of CTE mismatch therebetween that may result in deleterious stresses or even debonding during or after thermal cycles experienced by illumination device 600. As described above regarding FIGS. 3 and 4, the sub-assembly 315 and the waveguide 320 are typically in contact only at the joining elements 610 and there is otherwise an air gap between sub-assembly 315 and waveguide 320.

The CTE mismatch between the sub-assembly 315 and the waveguide 320 may arise due to these elements comprising or consisting of different materials, as mentioned above. For example, the sub-assembly 315 may include or consist essentially of a PCB or a material (such as a ceramic material) utilized in the formation of PCBs, and may thus have a CTE in the range of approximately 15 to 17 ppm/° C. Sub-assembly 315 may even include a metal plate, and may include or consist essentially of a metal-core PCB, where the metal may be, e.g., aluminum (having a CTE of approximately 24 ppm/° C.) and/or copper (having a CTE of approximately 18 ppm/° C.). In contrast, the waveguide 320 may include or consist essentially of, e.g., polymethylmethacrylate (PMMA), which has a CTE of approximately 70 ppm/° C.).

In a non-limiting exemplary embodiment presented to demonstrate potential CTE mismatch-related issues, the CTE-related stress experienced in an illumination device 600 (generally at the two or more joining elements 610) may be calculated. In the exemplary embodiment, the sub-assembly 315 has a $CTE_{SA}$ of approximately 24 ppm/° C. and the waveguide 320 has a $CTE_W$ of approximately 70 ppm/° C. For example, if a distance L between two joining elements 610 is 24 mm, then for a temperature change $\Delta T$ of 80° C., the difference in linear expansion $\Delta L$ between the two elements corresponds to:

$$\Delta L = (CTE_W - CTW_{SA}) \times \Delta T \times L = 88 \text{ µm}.$$

The resulting stress $\sigma$ in the waveguide 320, which has a Young's modulus $E_W$ of, e.g., 3.2 Gigapascals (GP), corresponds to:

$$\sigma = (\Delta L/L) = E_W = 11.7 \text{ Megapascals (MP)}.$$

Assuming that the two joining elements 610 in question have surface areas S of approximately 6 mm², then the force experienced at the joining elements 610 (and also the waveguide 320) corresponds to $F = \sigma \times S =$ approximately 70 Newtons (N).

Figure 7:
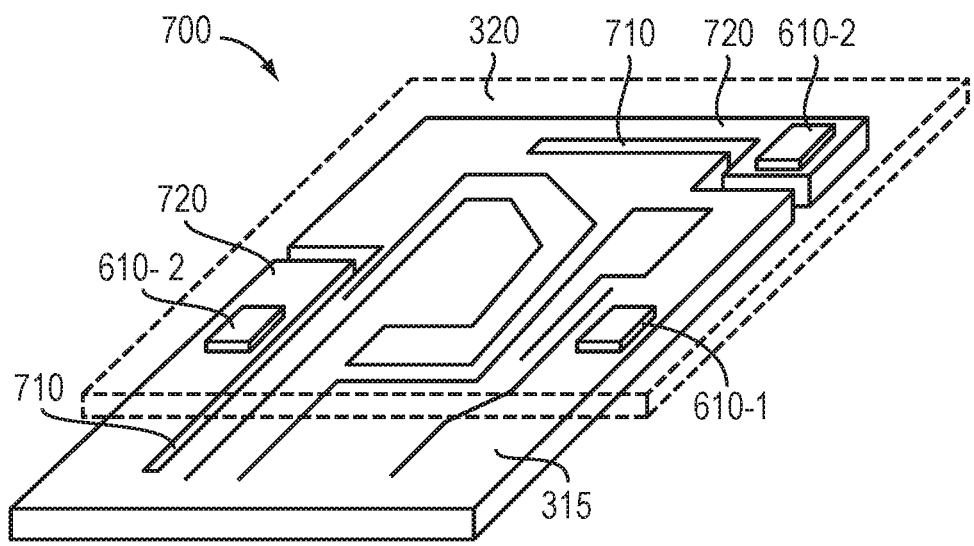
FIGS. 7-9 are perspective views of illumination devices incorporating features to reduce thermally induced stresses in accordance with various embodiments of the present invention.

As shown in FIG. 7, embodiments of the invention advantageously incorporate features to mitigate CTE-mismatch stresses. In accordance with various embodiments, an illumination device 700 includes sub-assembly 315 and waveguide 320, similar to illumination device 600 described above. As in illumination device 600, the sub-assembly 315 and waveguide 320 are attached at two or more joining elements 610, indicated in FIG. 7 as joining elements 610-1 and 610-2. As shown, illumination device 700 features one or more release trenches 710 (that preferably extend through the thickness of sub-assembly 315), thereby forming reliefs 720 on which one or more joining elements 610-2 are disposed The reliefs 720 remain connected to the bulk of the sub-assembly 315 along one dimension and at at least one point, but are substantially free to move along other dimensions (i.e., dimensions perpendicular to the direction of connection) and thus provide compliancy to the connection between sub-assembly 315 and waveguide 320. The reliefs 720 may be free to move elastically and may therefore be considered to be elastic springs that act to relieve CTE-mismatch stress during thermal cycles.

In order to maintain the alignment between sub-assembly 315 and waveguide 320, at least one joining element 610 (indicated as joining element 610-1) is maintained as a substantially rigid connection, i.e., a relief 720 is not formed thereunder. The beneficial impact of the reliefs 720 may be calculated utilizing many of the same exemplary values utilized above in relation to FIG. 6. For a relief having a length d of 10 mm a width w of 1.5 mm, and a thickness b of 1.3 mm, for the above-calculated displacement between joining elements 610 of 88 µm, the force induced at the end of the relief (and thus experienced at the joining element 610) is only approximately 5 N, a much smaller value than the 70 N experienced in the absence of the relief trenches 710.

Figure 8:
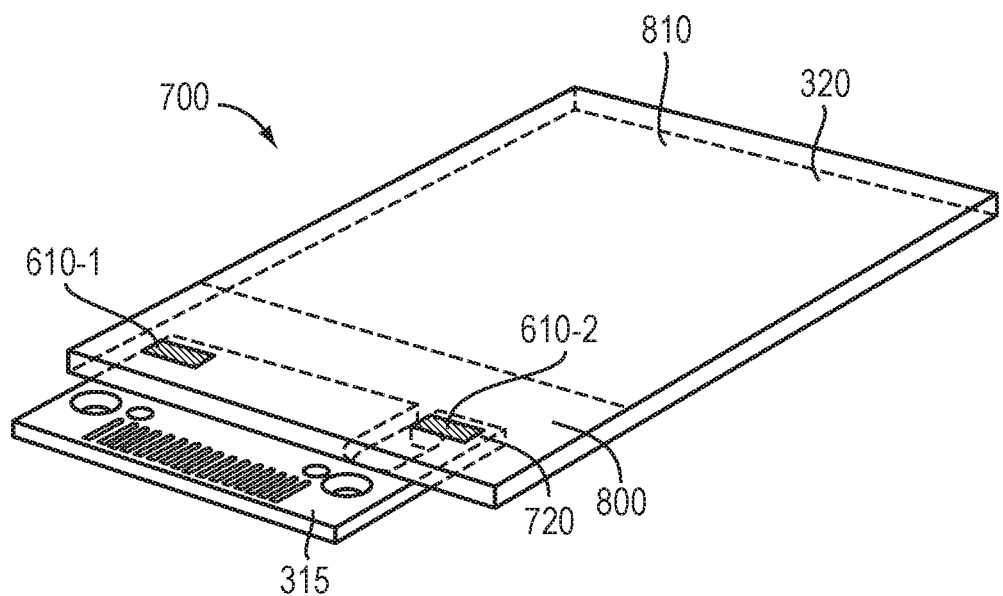
Figure 9:
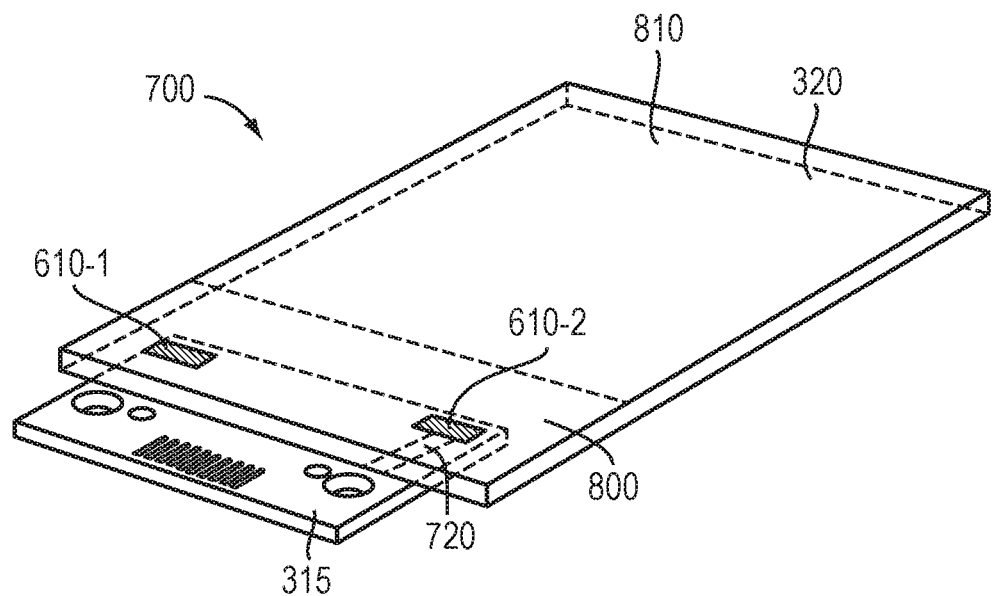

As shown in FIG. 7, and as also shown in FIGS. 8 and 9, the alignment and sizes of the relief trenches 710 may vary and may thus form a variety of differently sized and shaped reliefs 720 upon which compliant joining elements 610-2 are formed. FIGS. 8 and 9 also schematically depict an in-coupling region 800 and an out-coupling region 810 of the waveguide 320. Typically light emitted by an LED die 305 is in-coupled into the waveguide 320 in the in-coupling region 800, as shown in more detail and described in reference to FIGS. 3-5, and light is not emitted from the waveguide 320 in in-coupling region 800. At least a portion (or even all) of the in-coupling region 800 may be covered by an absorber 355, as shown in FIG. 3. The in-coupled light propagates within the waveguide 320 and is subsequently out-coupled (i.e., emitted) from, e.g., the top surface of the waveguide 320 in the out-coupling region 810.

Illumination apparatuses in accordance with embodiments of the present invention may also incorporate one or more phosphors or other photoluminescent materials as described in U.S. patent application Ser. No. 13/255,113, filed Sep. 7, 2011, the entire disclosure of which is incorporated by reference herein.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination device comprising:
   a waveguide having a recess defined in a first surface of the waveguide;
   a light-emitting diode (LED), light emitted by the LED being in-coupled into the waveguide at the recess; and
   a sub-assembly providing mechanical support to the LED and disposed proximate the first surface of the waveguide,
   wherein light from the LED is (i) confined via total internal reflection over at least a portion of the first surface of the waveguide and (ii) emitted from at least a portion of an emission surface of the waveguide different from the first surface.

2. The illumination device of claim 1, wherein an air gap is disposed between at least a portion of the sub-assembly and at least a portion of the first surface of the waveguide.

3. The illumination device of claim 1, wherein the sub-assembly is attached to the first surface of the waveguide only at a plurality of discrete attachment points.

4. The illumination device of claim 3, wherein at least one of the discrete attachment points comprises a substantially rigid joining element for facilitating alignment of the waveguide with the sub-assembly.

5. The illumination device of claim 1, further comprising a reflector disposed over at least a portion of a second surface of the waveguide to confine light within the waveguide.

6. The illumination device of claim 5, wherein the second surface is opposite the first surface.

7. The illumination device of claim 1, wherein the LED is disposed at least partially within the recess.

8. The illumination device of claim 1, further comprising an index-matching material disposed on at least a portion of the LED.

9. The illumination device of claim 8, wherein at least a portion of the index-matching material is disposed between the LED and the waveguide.

10. The illumination device of claim 1, wherein the LED consists essentially of a bare-die LED.

11. The illumination device of claim 1, further comprising a phosphor for converting a light emitted by the LED to light having a different wavelength.

12. The illumination device of claim 1, further comprising at least one index-matching material filling at least a portion of the recess.

13. The illumination device of claim 1, wherein the first surface and the emission surface are substantially planar.

14. The illumination device of claim 1, wherein the waveguide comprises (i) an in-coupling region in which light emitted by the LED is in-coupled into the waveguide, and (ii) an out-coupling region, discrete from the in-coupling region, from which light is out-coupled through the emission surface.

15. The illumination device of claim 14, wherein the out-coupling region is laterally spaced away from the LED.

16. The illumination device of claim 14, wherein an emission face of the LED faces the out-coupling region, the emission face of the LED being longer than an adjoining face of the LED.

17. The illumination device of claim 1, wherein the first surface is substantially parallel to the emission surface.

18. The illumination device of claim 1, wherein the first surface is substantially perpendicular to the emission surface.

19. The illumination device of claim 1, wherein the sub-assembly has at least one relief trench extending therethrough to define a relief, the relief being elastically deformable at least in a first direction.

20. The illumination device of claim 19, wherein the waveguide is attached to the sub-assembly at least at a first attachment point disposed on the relief.

\* \* \* \* \*